(12) United States Patent
Chen

(10) Patent No.: US 10,136,565 B2
(45) Date of Patent: Nov. 20, 2018

(54) APPARATUS FOR CONTROLLING WATER SYSTEM FOULING

(71) Applicant: Kuan Ming Chen, Kaohsiung (TW)

(72) Inventor: Kuan Ming Chen, Kaohsiung (TW)

( * ) Notice: Subject to any disclaimer, the term of this patent is extended or adjusted under 35 U.S.C. 154(b) by 334 days.

(21) Appl. No.: 14/795,896

(22) Filed: Jul. 10, 2015

(65) Prior Publication Data

US 2015/0313039 A1 Oct. 29, 2015

(51) Int. Cl.
*C02F 1/00* (2006.01)
*H05K 7/20* (2006.01)
*C02F 1/46* (2006.01)
*C02F 103/02* (2006.01)

(52) U.S. Cl.
CPC ....... *H05K 7/20909* (2013.01); *C02F 1/4602* (2013.01); *C02F 2103/023* (2013.01); *C02F 2209/02* (2013.01); *C02F 2209/05* (2013.01)

(58) Field of Classification Search
CPC .................................. B01D 3/02; G01K 1/14
USPC ............ 165/11.1; 374/29, 100; 202/81, 202, 202/241; 210/96.1, 139; 204/400
See application file for complete search history.

(56) References Cited

U.S. PATENT DOCUMENTS

| | | | | |
|---|---|---|---|---|
| 5,110,418 A | * | 5/1992 | Garrison | B01D 3/02 137/392 |
| 5,192,464 A | * | 3/1993 | Pawlowski | F24F 5/0035 261/112.2 |
| 5,751,599 A | * | 5/1998 | Bortnik | F28F 25/00 137/5 |
| 6,740,231 B1 | * | 5/2004 | Bauman | C02F 5/025 210/139 |
| 8,147,130 B2 | * | 4/2012 | Sakami | G01B 21/085 374/134 |
| 8,444,118 B1 | * | 5/2013 | Dumler | F28F 25/00 261/26 |
| 8,851,100 B2 | * | 10/2014 | Petzoldt | F01K 9/00 137/115.01 |
| 2012/0145561 A1 | * | 6/2012 | Coulon | G01N 33/1886 205/778.5 |
| 2014/0177673 A1 | * | 6/2014 | Bliss | G01N 25/18 374/165 |
| 2015/0175459 A1 | * | 6/2015 | Hofmann | C02F 5/00 137/5 |

* cited by examiner

*Primary Examiner* — Nina Bhat

(57) ABSTRACT

An apparatus for controlling water system fouling includes a control panel including a display and a plurality of push buttons; a power assembly disposed below the control panel; and a heat dissipation device disposed on two sides of both the control panel and the power assembly. The power assembly includes two polarity sockets, two conductivity sockets, a power socket, an on/off switch, a backup socket, a pump socket, and a drain socket.

1 Claim, 13 Drawing Sheets

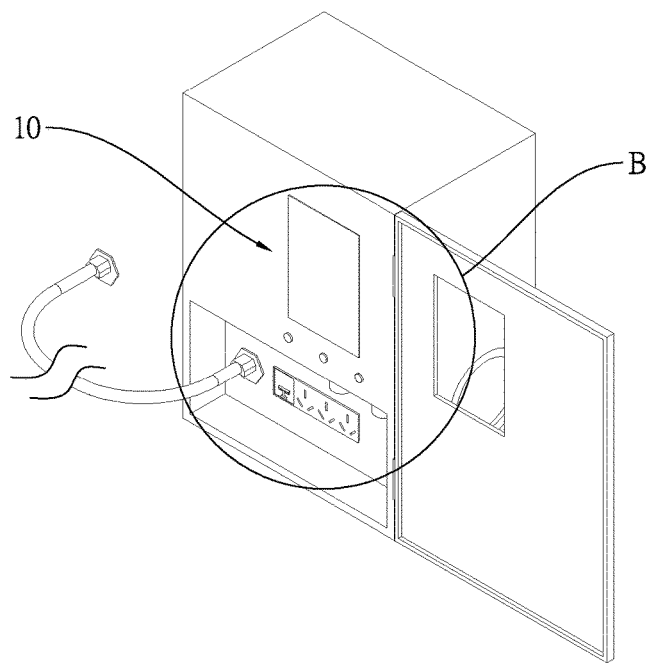
FIG.7
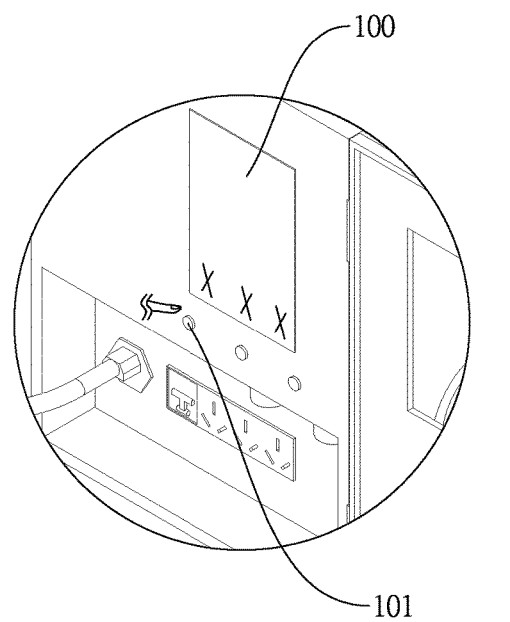 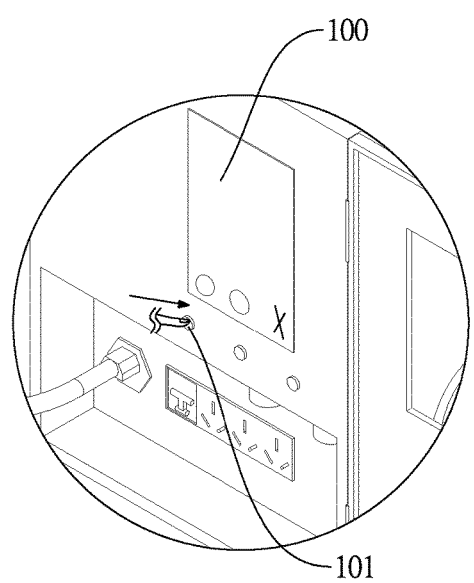
FIG.7A  FIG.7B

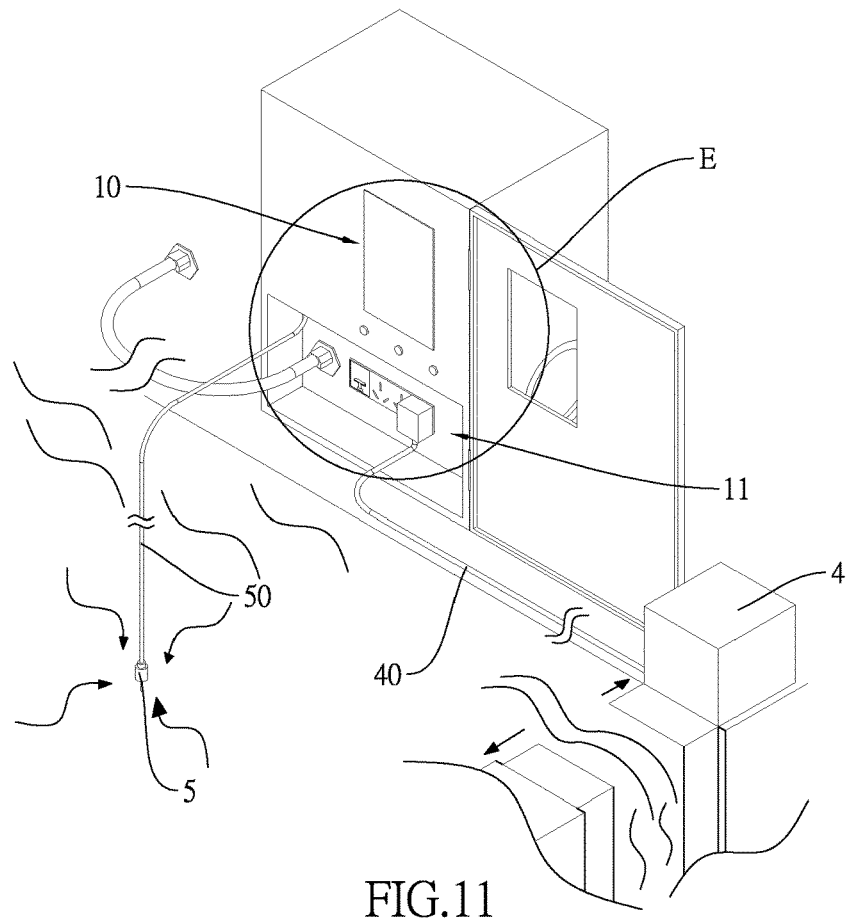
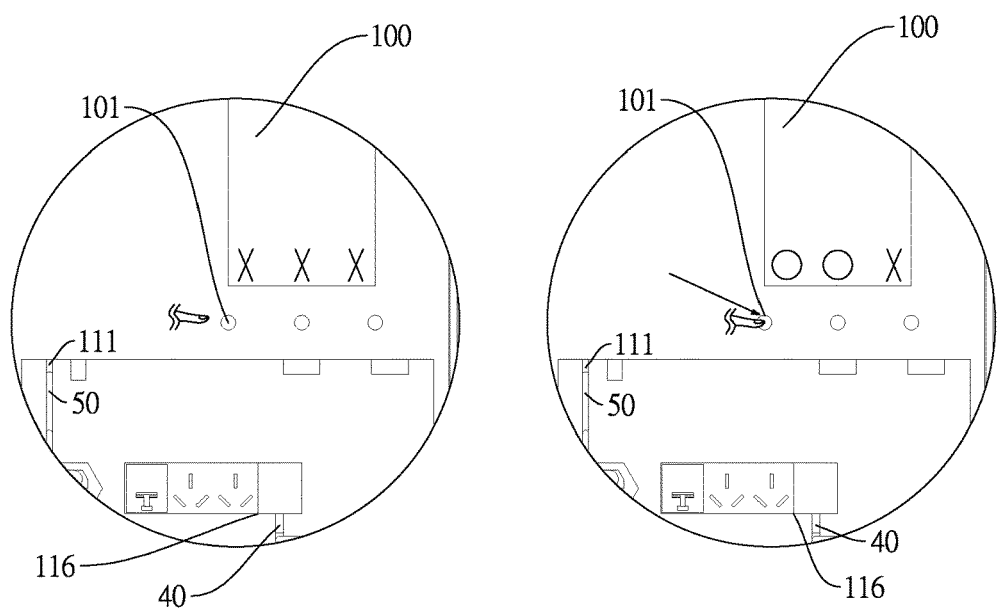
FIG.11
FIG.11A　　　　FIG.11B

APPARATUS FOR CONTROLLING WATER SYSTEM FOULING

BACKGROUND OF THE INVENTION

1. Field of the Invention

The invention relates to foul removal and more particularly to an apparatus for controlling fouling in cooling water of a cooling water system.

2. Description of Related Art

It has been known that rust iron and inorganic salts may foul water systems and lead to very significant water system inefficiencies. These inefficiencies result in increased energy consumption and increased maintenance demands which, in turn, increase overall operational and maintenance costs by several orders of magnitude.

A conventional apparatus for generating ions within a water system comprises a water tank including a cylindrical tank interior, the tank interior including upper and lower tank portions, and the water tank further including a tank aperture at the upper tank portion whereby the tank interior is made accessible through the aperture and a side wall, a water inlet assembly, a water outlet assembly, and an ion generator including at least one anode and at least one cathode. Ions are generated.

While the device enjoys its success in the market, continuing improvements in the exploitation of apparatus for removing fouling are constantly sought.

SUMMARY OF THE INVENTION

It is therefore one object of the invention to provide an apparatus for controlling water system fouling comprises a control panel including a display and a plurality of push buttons; a power assembly disposed below the control panel; and a heat dissipation device disposed on two sides of the control panel and the power assembly.

The above and other objects, features and advantages of the invention will become apparent from the following detailed description taken with the accompanying drawings.

BRIEF DESCRIPTION OF THE DRAWINGS

FIG. 7 is a perspective view of the apparatus showing a second operation step of the apparatus;

FIG. 7A is a detailed view of the area in circle B of FIG. 7;

FIG. 7B is a view similar to FIG. 7A showing the push button pressed by a finger;

FIG. 11 is a perspective view of the apparatus showing a sixth operation step of the apparatus;

FIG. 11A is a detailed view of the area in circle E of FIG. 11;

FIG. 11B is a view similar to FIG. 11A showing the push button pressed by a finger;

DETAILED DESCRIPTION OF THE INVENTION

Figure 1:
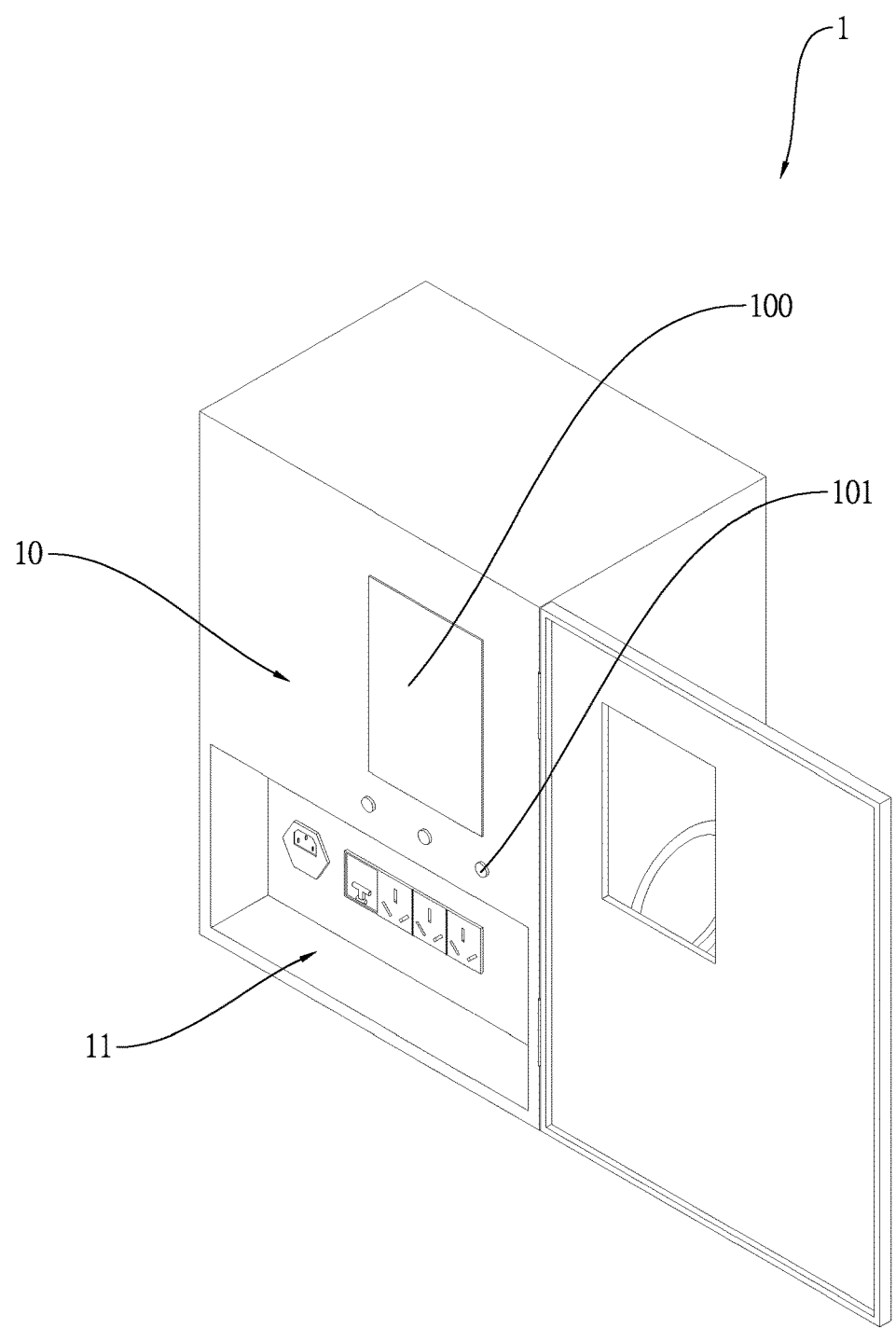
FIG. 1 is a perspective view of an apparatus for controlling water system fouling according to the invention with the cover open.
Figure 2:
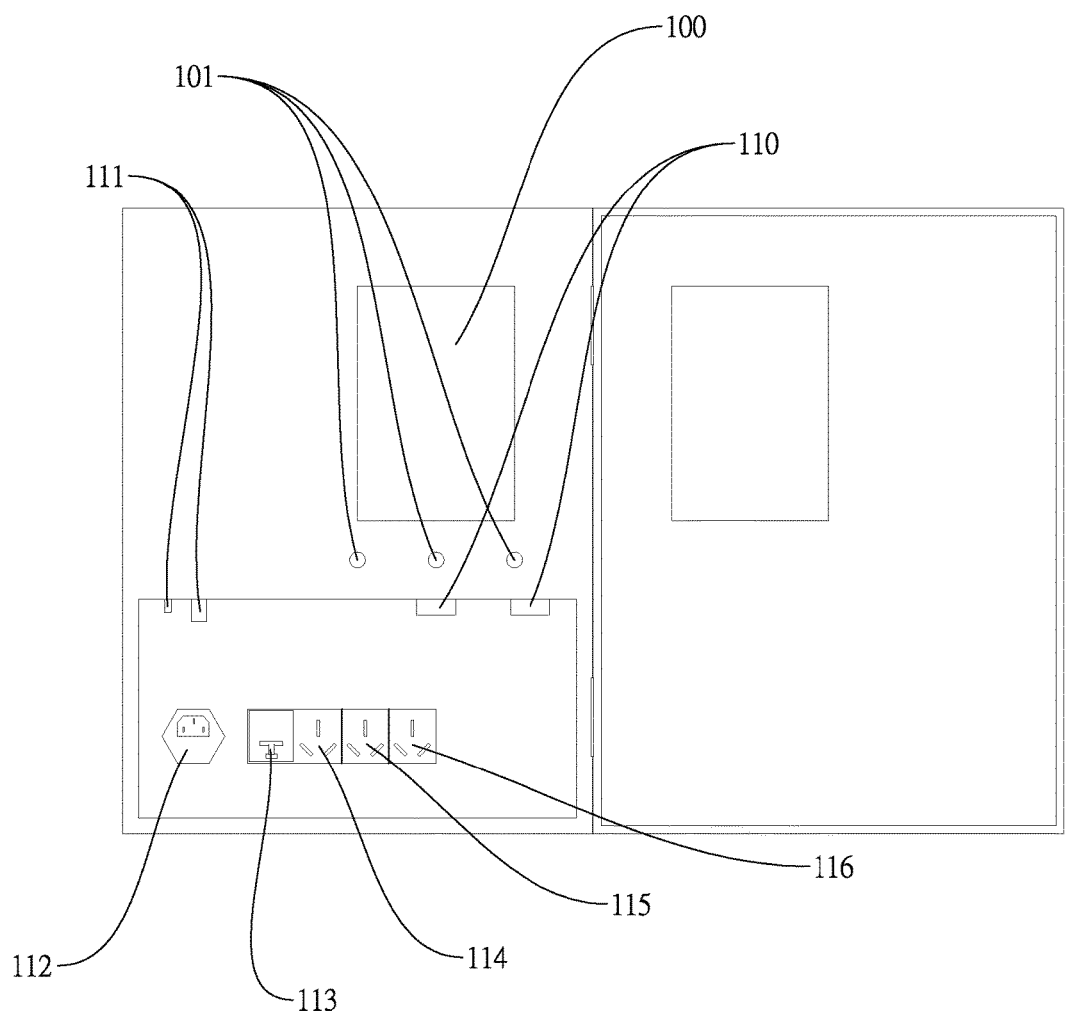
FIG. 2 is a front view of the apparatus.
Figure 3:
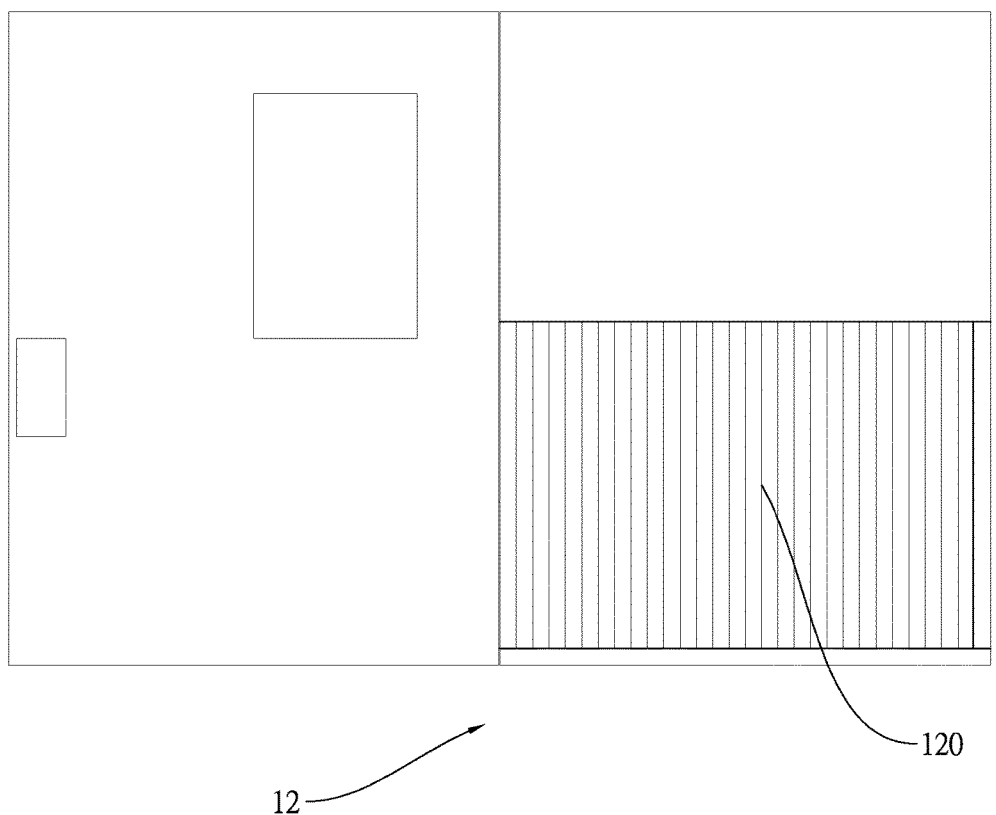
FIG. 3 is a side elevation of the apparatus showing a heat dissipation device.
Figure 4:
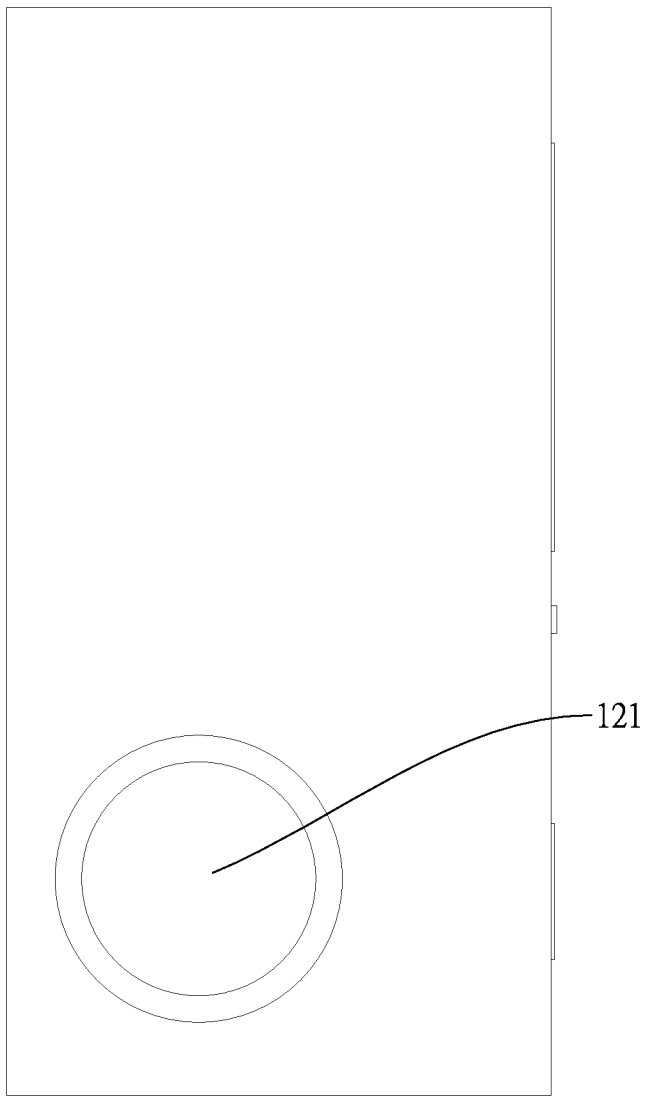
FIG. 4 is a side elevation of the apparatus showing a first fan of the heat dissipation device.
Figure 5:
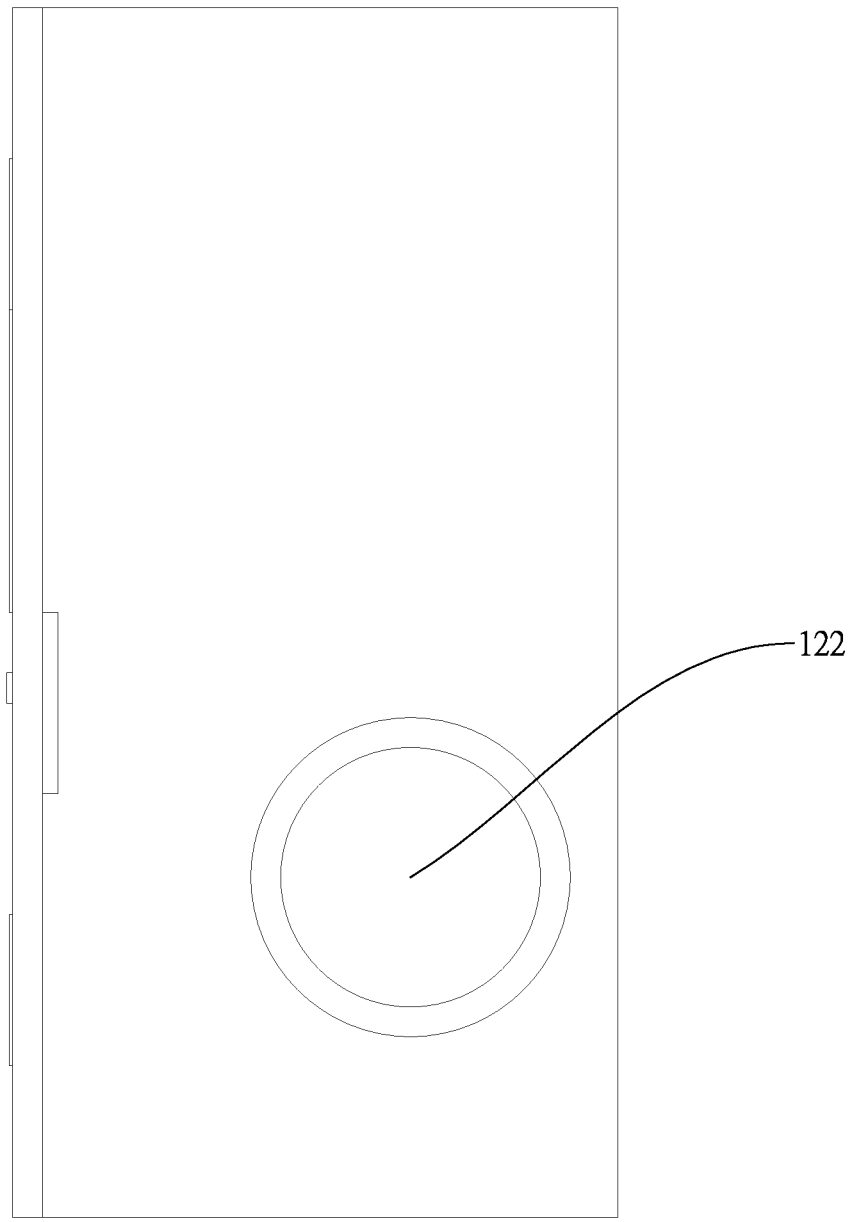
FIG. 5 is a side elevation of the apparatus showing a second fan of the heat dissipation device.
Figure 6:
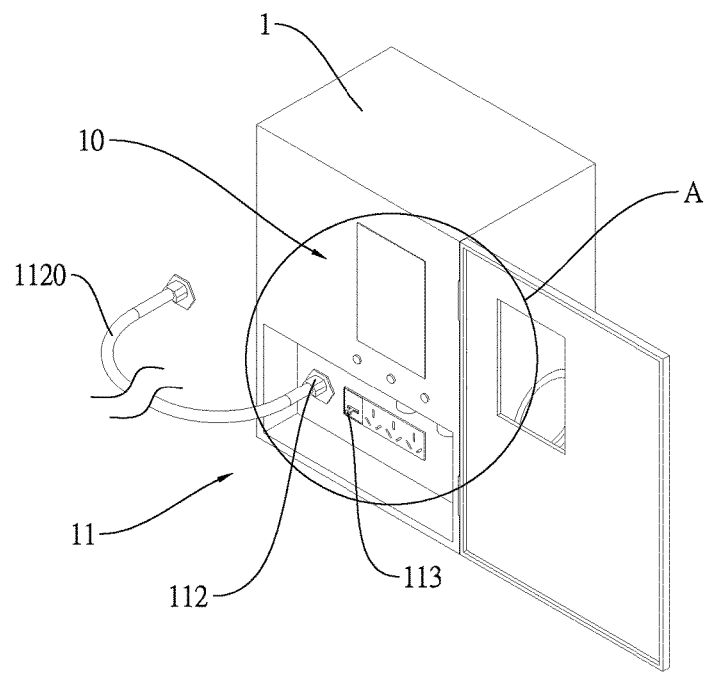
FIG. 6 is a perspective view of the apparatus showing a first operation step of the apparatus.
Figure 6A:
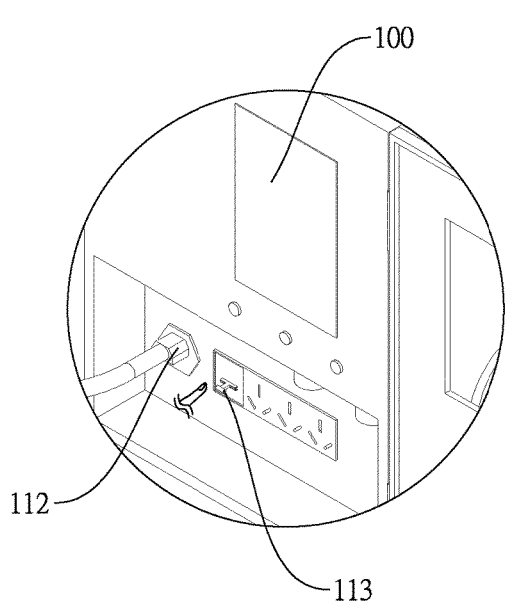
FIG. 6A is a detailed view of the area in circle A of FIG. 6.
Figure 6B:
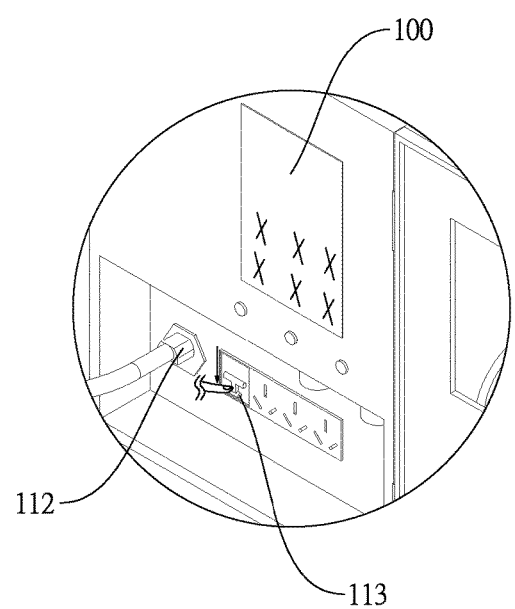
FIG. 6B is a view similar to FIG. 6A showing the on/off switch pressed by a finger.
Figure 8:
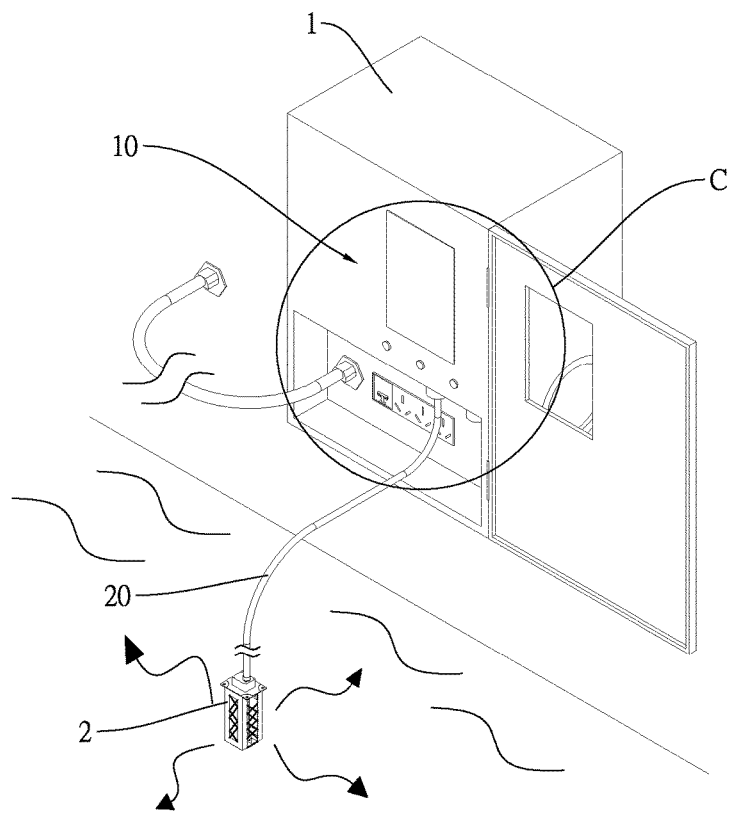
FIG. 8 is a perspective view of the apparatus showing a third operation step of the apparatus.
Figure 8A:
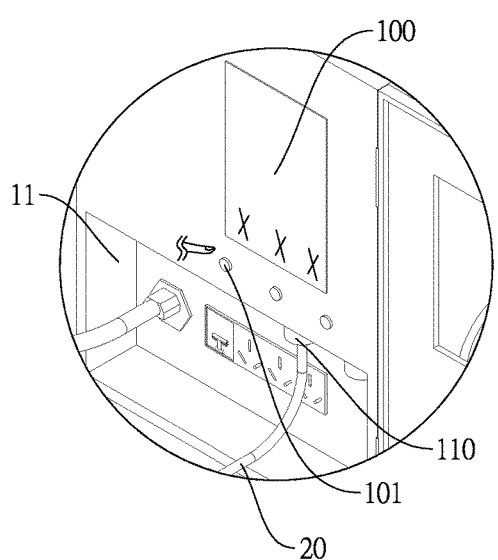
FIG. 8A is a detailed view of the area in circle C of FIG. 8.
Figure 8B:
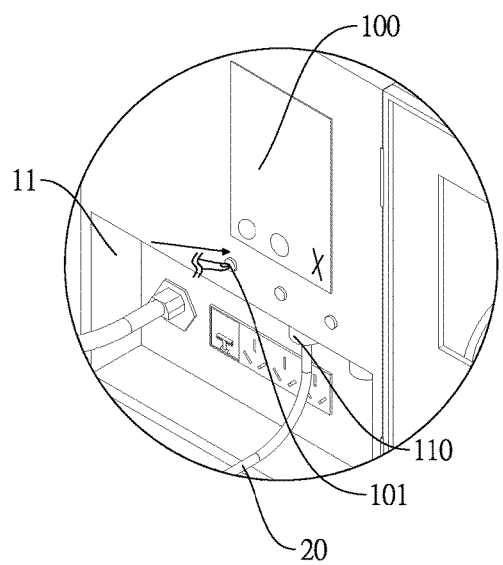
FIG. 8B is a view similar to FIG. 8A showing the push button pressed by a finger.
Figure 9:
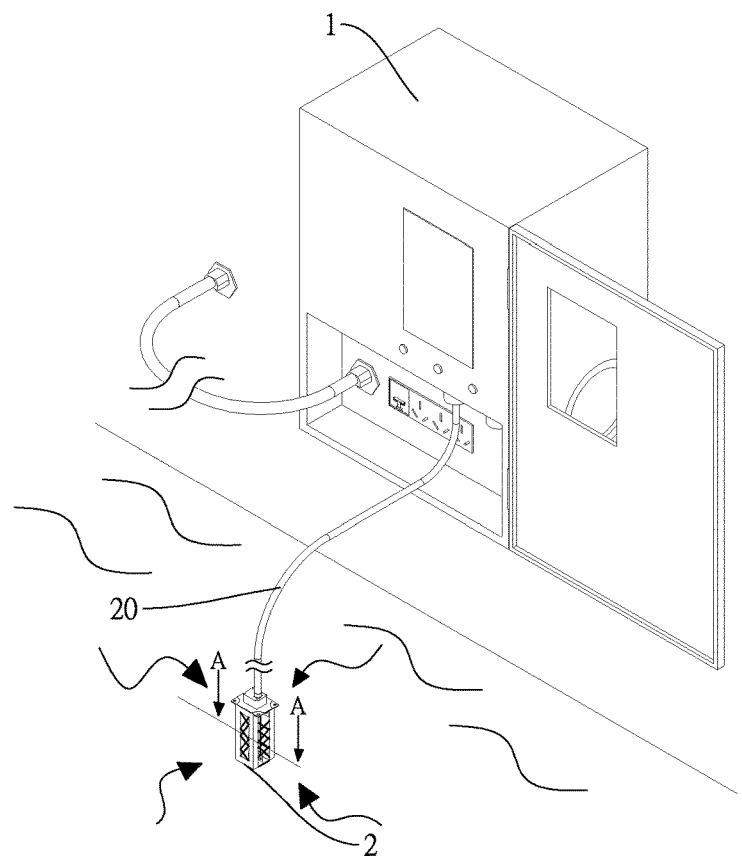
FIG. 9 is a perspective view of the apparatus showing a fourth operation step of the apparatus.
Figure 9A:
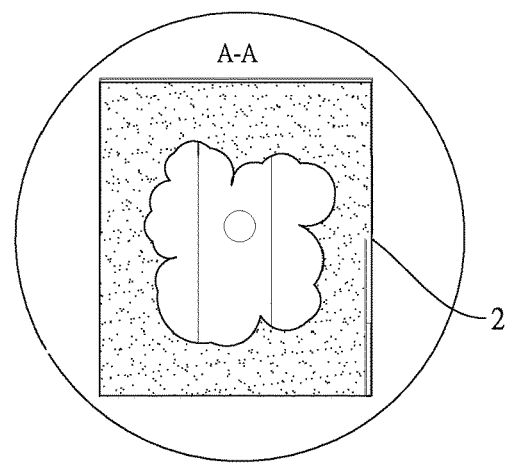
FIG. 9A is a sectional view taken along line A-A of FIG. 9.
Figure 10:
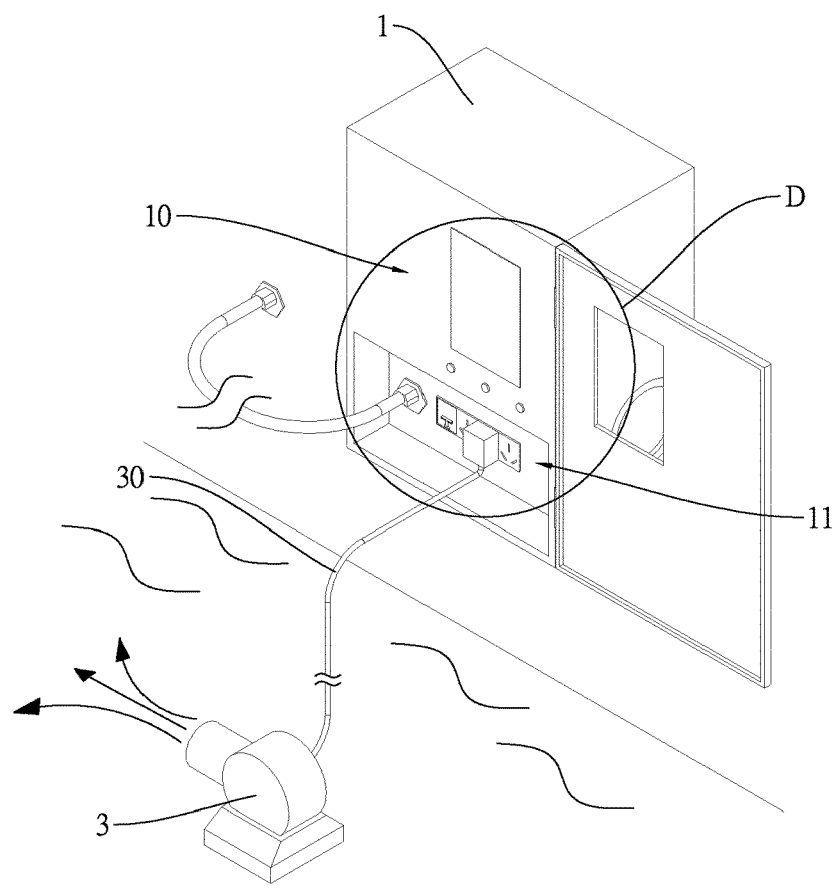
FIG. 10 is a perspective view of the apparatus showing a fifth operation step of the apparatus.
Figures 10A, 10B:
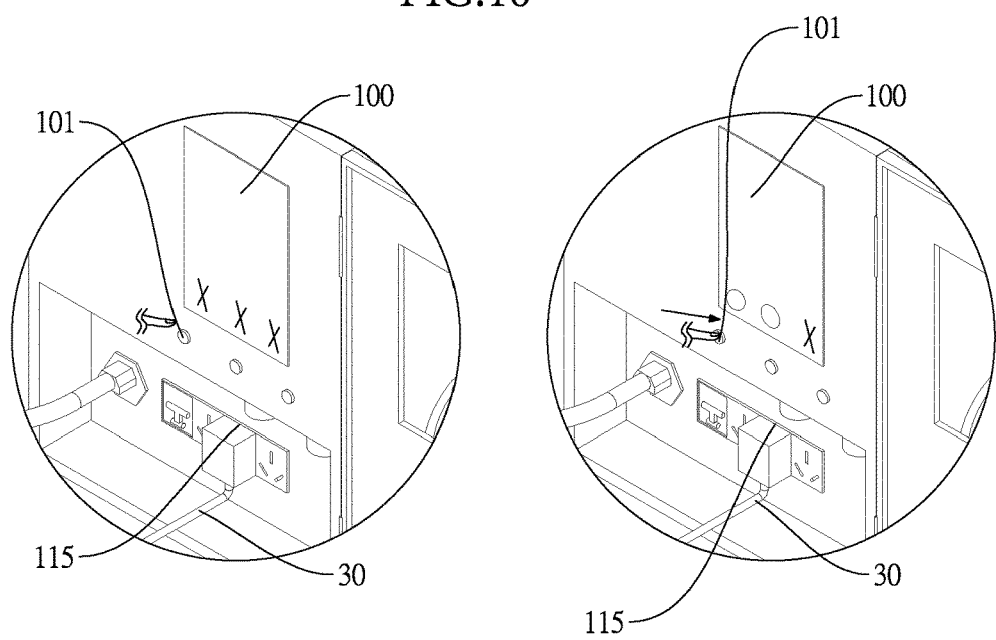
FIG. 10A is a detailed view of the area in circle D of FIG. 10.
FIG. 10B is a view similar to FIG. 10A showing the push button pressed by a finger.

Referring to FIGS. 1 to 13, an apparatus 1 for controlling water system fouling in accordance with the invention comprises the following components as discussed in detail below.

A control panel 10 includes a display 100 and a plurality of push buttons 101 under the display 100. A power assembly 11 is disposed below the control panel 10 and includes two polarity sockets 110, two conductivity sockets 111, a power socket 112, an on/off switch 113, a backup socket 114, a pump socket 115, and a drain socket 116. A heat dissipation device 12 is provided on one sides of both the control panel 10 and the power assembly 11 and includes a plurality of fins 120. The heat dissipation device 12 further includes a first fan 121 and a second fan 122.

Operations of the invention are described in detail below. First, connect the power socket 112 to a first electric wire 1120 which is electrically connected to a line power. Next, turn on the on/off switch 113. As a result, current, voltage, and power are shown on the display 100 (see FIG. 6). Next, an employee may press one or more push buttons 101 to adjust current and/or voltage (see FIG. 7). An apparatus 2 for metallic particles separation submersed in cooling water is electrically connected to the polarity socket 110 using a second electric wire 20. Next, the employee may press one or more push buttons 101 to adjust current and/or voltage (see FIG. 8). Metallic particles in the water can be separated to adhere to the surface of the apparatus 2 to form as fouling which can be cleaned in the future (see FIG. 9). The employee may electrically connect a pump (not shown) to the pump socket 115 by a third electric wire 30 so that the pump may supply electrolyte from an electrolyte source (not shown) to the apparatus 2. The employee may monitor data including the amount of electrolyte on the display 100 for adjustment (see FIG. 10). The activation of the pump can be set by programming. The employee may connect the drain socket 116 to a drain valve 4 using a fourth electric wire 40. Also, the employee may connect the conductivity socket 111 to a conductivity sensor 5 using a fifth electric wire 50. Next, the employee may press one or more push buttons 101 to set desired conductivity. The drain valve 4 will be activated when the desired conductivity is reached (see FIG. 11). Automatic output control can be achieved by measuring water temperature and water conductivity.

Figure 12:
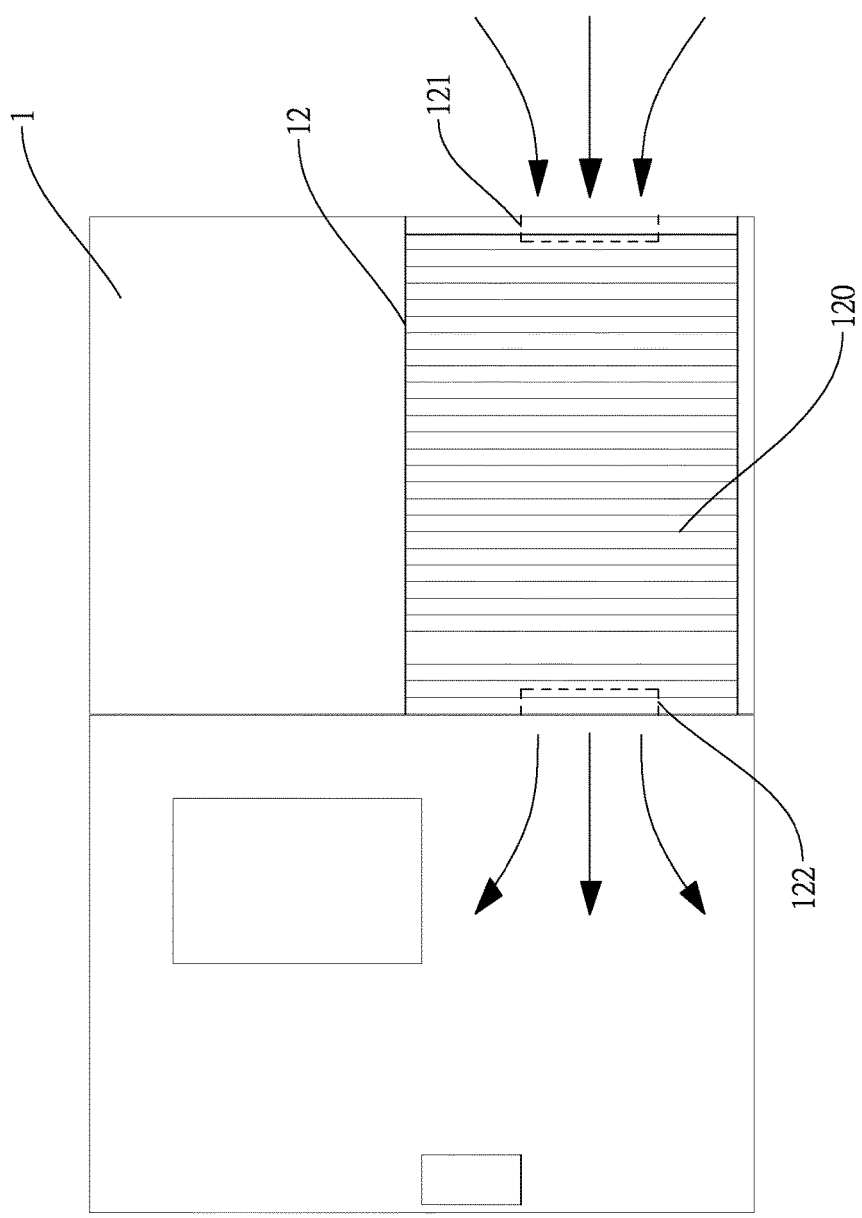
FIG. 12 is a side elevation of the apparatus showing how the heat dissipation device is working.

As shown in FIG. 12, cold air is introduced into the apparatus 1 by the first fan 121. Excessive heat in the apparatus 1 is absorbed by the fins 120 and is carried to the second fan 122 by the air. Finally, hot air is expelled out of the apparatus 1 by the second fan 122.

Figure 13:
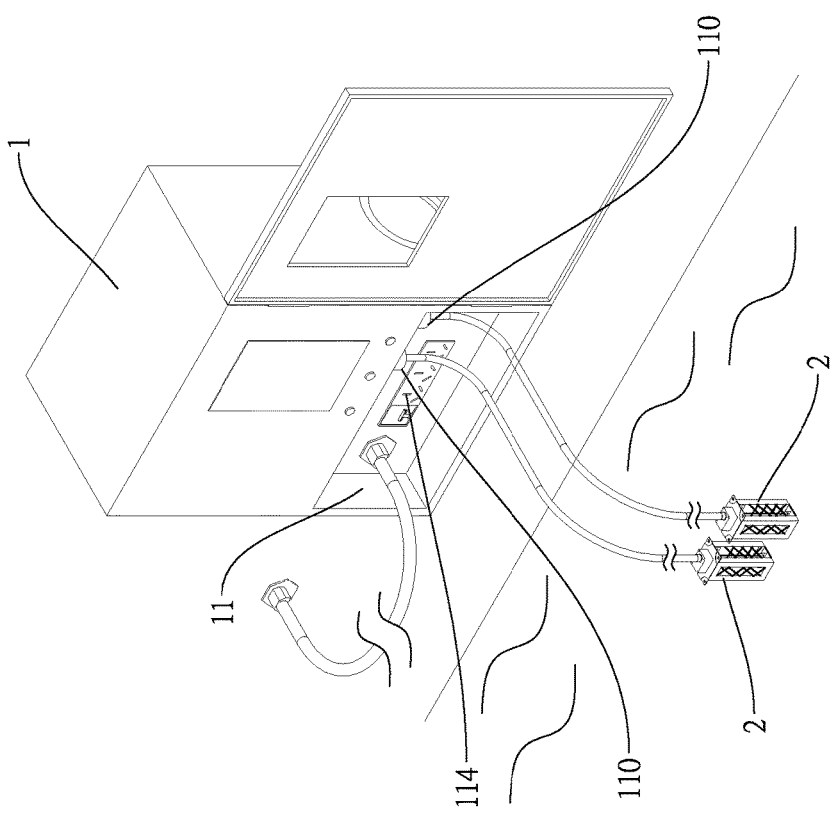
FIG. 13 is a perspective view of the apparatus showing two electrode assemblies connected to the polarity sockets of the apparatus by electric wires.

As shown in FIG. 13, the polarity sockets 110 may be connected to two electrode assemblies 2 using an electric wire if such need arises.

While the invention has been described in terms of preferred embodiments, those skilled in the art will recognize that the invention can be practiced with modifications within the spirit and scope of the appended claims.

What is claimed is:

1. An apparatus for controlling water system fouling comprising:

a control panel including a display and a plurality of push buttons;

a power assembly disposed below the control panel and including two polarity sockets, two conductivity sockets, a power socket, an on/off switch, and a backup socket;

a device electrically connected to the polarity sockets configured to separate metallic particles from water, said metal particles adhering to the device preventing fouling;

a heat dissipation device disposed on two sides of both the control panel and the power assembly and including a first fan, a second fan, and a plurality of fins;

and wherein an automatic output control is achieved by measuring water temperature and water conductivity;

and wherein the push buttons are configured to be pressed to adjust at least one of current and voltage supplied to the power assembly.

\* \* \* \* \*